United States Patent
Notsu et al.

(10) Patent No.: US 8,896,114 B2
(45) Date of Patent: Nov. 25, 2014

(54) SEMICONDUCTOR DEVICE

(71) Applicant: Sumitomo Electric Industries, Ltd., Osaka (JP)

(72) Inventors: Hiroshi Notsu, Osaka (JP); Takahiro Sugimura, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 126 days.

(21) Appl. No.: 13/829,639

(22) Filed: Mar. 14, 2013

(65) Prior Publication Data

US 2013/0264697 A1  Oct. 10, 2013

Related U.S. Application Data

(60) Provisional application No. 61/621,253, filed on Apr. 6, 2012.

(30) Foreign Application Priority Data

Apr. 6, 2012 (JP) ................................ 2012-087111

(51) Int. Cl.
*H01L 23/48* (2006.01)
*H01L 23/049* (2006.01)
*H01L 23/373* (2006.01)
*H01L 23/495* (2006.01)
*H01L 23/24* (2006.01)
*H01L 23/31* (2006.01)

(52) U.S. Cl.
CPC .............. *H01L 23/48* (2013.01); *H01L 23/049* (2013.01); *H01L 23/3735* (2013.01); *H01L 23/4952* (2013.01); *H01L 23/49551* (2013.01); *H01L 23/49562* (2013.01); *H01L 2224/0603* (2013.01); *H01L 2224/32245* (2013.01); *H01L 2224/48091* (2013.01); *H01L 2224/48247* (2013.01); *H01L 2224/49109* (2013.01); *H01L 2224/49111* (2013.01); *H01L 2224/73265* (2013.01); *H01L 2224/45147* (2013.01); *H01L 2924/01015* (2013.01); *H01L 23/24* (2013.01); *H01L 23/3107* (2013.01)
USPC .......................... 257/690; 257/678; 438/106

(58) Field of Classification Search
CPC ................................ H01L 24/49; H01L 23/48
USPC .................................. 257/678, 690; 438/106
See application file for complete search history.

(56) References Cited

U.S. PATENT DOCUMENTS 7,800,224 B2 * 9/2010 Lee et al. ....................... 257/724
2011/0049535 A1 * 3/2011 Soeno ............................. 257/77

FOREIGN PATENT DOCUMENTS

| JP | 63-082949 | | 5/1988 |
| JP | 10-261756 | A | 9/1998 |
| JP | 11-330132 | A | 11/1999 |
| JP | 2003-258178 | A | 9/2003 |
| JP | 2006-073904 | A | 3/2006 |

OTHER PUBLICATIONS

Notice of Allowance in Japanese Patent Application No. 2012-087111, dated Sep. 10, 2013.
Kazuhiro Takasusuki, "Failure cause and reliability improvement/evaluation technique for wire bonding with focusing on Cu wire," Technical Information Institute Co., Ltd., Jul. 29, 2011, pp. 163, 263.
Notice of Reasons for Rejection in Japanese Patent Application No. 2012-087111, dated May 28, 2013.

* cited by examiner

*Primary Examiner* — Theresa T Doan
(74) *Attorney, Agent, or Firm* — Venable LLP; Michael A. Sartori

(57) ABSTRACT

A semiconductor device includes a semiconductor chip, a die pad having a chip mount surface for mounting the semiconductor chip, and an electrode terminal for connecting with the semiconductor chip through first and second wirings. The electrode terminal has a first surface including a connection point with the first wiring and a second surface including a connection point with the second wiring. The connection point with the first wiring is located at a first height from a reference plane extending from the chip mount surface. The connection point with the second wiring is located at a second height different from the first height from the reference plane.

3 Claims, 7 Drawing Sheets

SEMICONDUCTOR DEVICE

CROSS-REFERENCE RELATED APPLICATIONS

This application claims priority to Provisional Application Ser. No. 61/621,253, filed on Apr. 6, 2012 and claims the benefit of Japanese Patent Application No. 2012-87111, filed on Apr. 6, 2012, all of which are incorporated herein by reference in their entirety.

BACKGROUND

1. Field

The present invention relates to a semiconductor device.

2. Related Background

Known as examples of semiconductor devices include those of a case type and those of a resin seal type (see *Causes of Failures and Techniques for Improving and Evaluating Reliability of Wire Bonding Focused on Cu Wires*, Technical Information Institute Co., Ltd., Jul. 29, 2011, p. 163 and p. 263). In such a semiconductor device, a semiconductor chip mounted on a die pad is connected to an electrode terminal through a wire.

SUMMARY

There is a case where a semiconductor chip is connected to a source electrode terminal through a plurality of thin wires instead of a single thick wire. In this case, end parts of a plurality of wires can be arranged dispersedly on a source electrode pad disposed on a surface of the semiconductor chip, which can inhibit currents from locally concentrating on the surface of the semiconductor chip. This can also disperse the load borne by the semiconductor chip under ultrasonic waves, pressures, or the like upon wire bonding over the surface of the semiconductor chip.

However, increasing the number of wires when using a plurality of wires raises the possibility of wires coming into contact with each other. When the wires come into contact with each other, currents may concentrate at the place of contact, thereby generating heat.

It is an object of the present invention to provide a semiconductor device in which wirings for connecting a semiconductor chip to an electrode terminal are hard to come into contact with each other.

The semiconductor device in accordance with one aspect of the present invention comprises a semiconductor chip, a die pad having a chip mount surface for mounting the semiconductor chip, and an electrode terminal for connecting with the semiconductor chip through first and second wirings; wherein the electrode terminal has a first surface including a connection point with the first wiring and a second surface including a connection point with the second wiring; wherein the connection point with the first wiring is located at a first height from a reference plane extending from the chip mount surface; and wherein the connection point with the second wiring is located at a second height different from the first height from the reference plane.

In this semiconductor device, the height of the connection point with the first wiring differs from that of the connection point with the second wiring. Therefore, the distance between the first and second wirings in the height direction can be made greater than that in the case where the connection points have the same height.

In one embodiment, the electrode terminal may have a riser disposed between the first and second surfaces.

In this case, both of the first and second surfaces can be arranged parallel to the reference plane. This makes it easier for the first and second wirings to connect with the first and second surfaces, respectively.

In one embodiment, a material of the semiconductor chip may include a wide bandgap semiconductor.

The necessity for silicon (Si) to use a number of wirings is low, since only small currents flow through a semiconductor chip made thereof. However, there is a higher necessity for wide bandgap semiconductors to increase the number of wirings in order to inhibit currents from concentrating, since larger currents flow through semiconductor chips made thereof than in those made of silicon. It is also harder for the wide bandgap semiconductors to make semiconductor chips larger, since they have a manufacturing yield lower than that of silicon. Therefore, a number of wirings are connected to a small semiconductor chip made of the wide bandgap semiconductor. It is therefore important in particular for the wide bandgap semiconductors to prevent wirings from coming into contact with each other.

In one embodiment, the semiconductor device may further comprise a case for containing the semiconductor chip and the die pad, while the electrode terminal may be attached to the case.

In this case, a case-shaped semiconductor device can be obtained.

As mentioned above, a semiconductor device in which wirings for connecting a semiconductor chip to an electrode terminal are hard to come into contact with each other can be provided.

DETAILED DESCRIPTION

In the following, embodiments of the present invention will be explained in detail with reference to the accompanying drawings. In the explanation of the drawings, the same or equivalent constituents will be referred to with the same signs while omitting their overlapping descriptions.

First Embodiment

Figure 1:
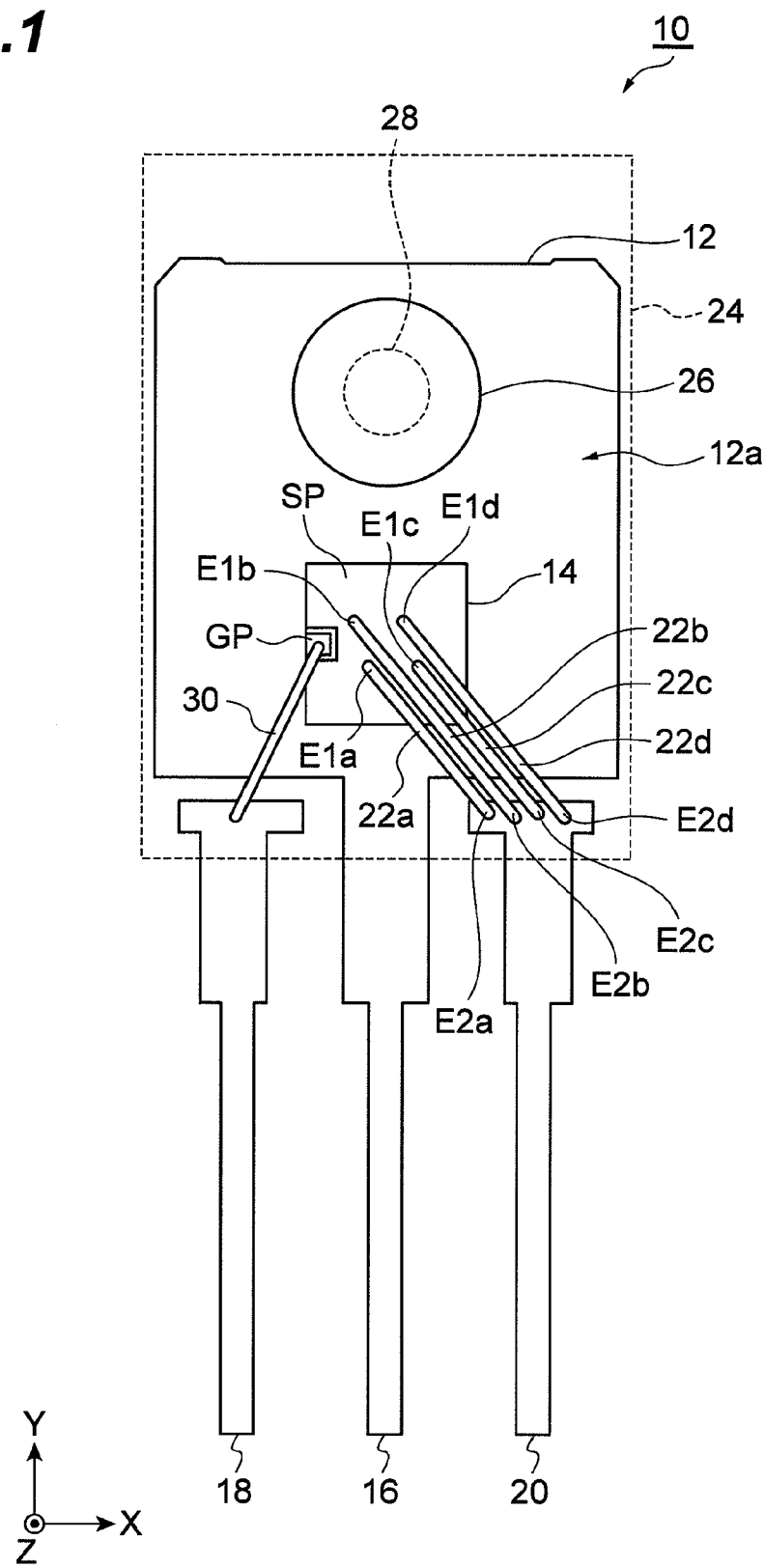
FIG. 1 is a plan view schematically illustrating the semiconductor device in accordance with a first embodiment.
Figure 2:
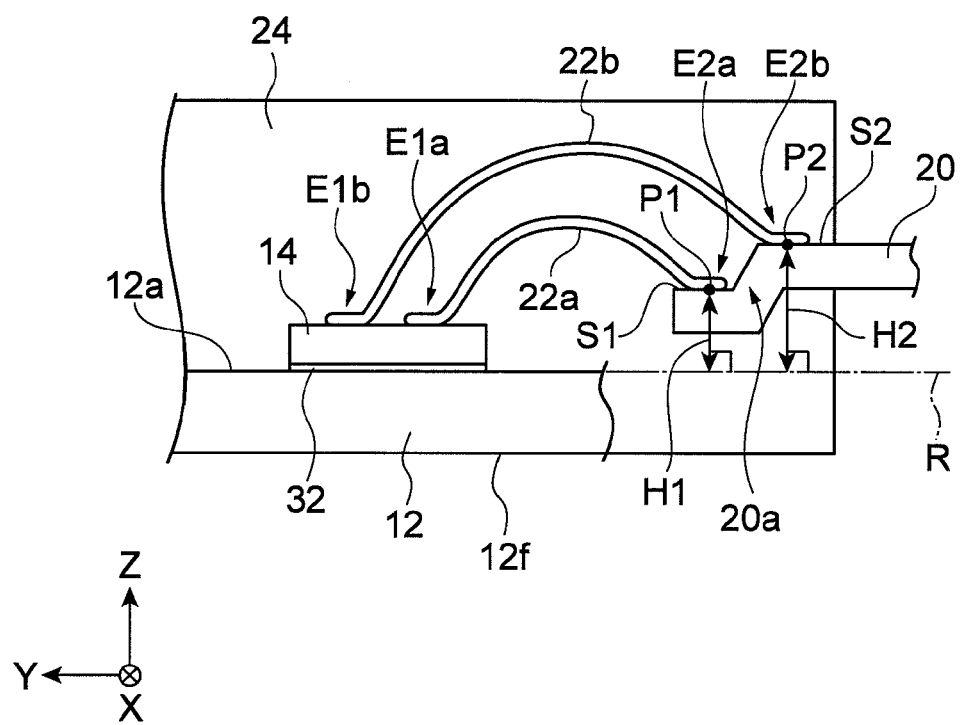
FIG. 2 is a diagram schematically illustrating a part of the semiconductor device as seen in the X direction of FIG. 1.

FIG. 1 is a plan view schematically illustrating the semiconductor device in accordance with the first embodiment. FIG. 1 depicts an XYZ orthogonal coordinate system. FIG. 2 is a diagram schematically illustrating a part of the semiconductor device as seen in the X direction of FIG. 1. The semiconductor device 10 illustrated in FIGS. 1 and 2 is a semiconductor device of a resin seal type. The semiconductor device 10 comprises a die pad 12, a semiconductor chip (or semiconductor element) 14, and a lead 20 serving as an electrode terminal.

The semiconductor device 10 may further comprise leads 16, 18 serving as other electrode terminals. The leads 16, 18, 20 are arranged in a row along the X direction. The lead 16 is located between the leads 18, 20. The leads 16, 18, 20 and the die pad 12 may constitute a lead frame. The semiconductor device 10 is a power semiconductor device used for a power supply or the like, for example. Examples of package forms for the semiconductor device 10 include typical TO series. Examples of the TO series include TO-247, TO-220, TO-263 (D2-PAK), and TO-252 (D-PAK).

The die pad 12 has a chip mount surface 12*a* for mounting the semiconductor chip 14. The die pad 12 can electrically be connected to the semiconductor chip 14. The die pad 12 has a planar form, for example. The chip mount surface 12*a* is rectangular, for example. Examples of materials for the die pad 12 include metals such as copper (Cu) and copper alloys. The die pad 12 may be formed with a through hole 26 which penetrates therethrough in the thickness direction. The through hole 26 is a hole for inserting therethrough a screw, for example, when securing the semiconductor device 10 to another member with the screw.

The semiconductor chip 14 is mounted on the chip mount surface 12*a* at a predetermined position. Examples of the semiconductor chip 14 include transistors such as bipolar transistors, MOS-FET, and insulated gate bipolar transistors (IGBT) and diodes. The semiconductor chip 14 can be mounted on the chip mount surface 12*a* with a bonding layer 32 constituted by a material including leaded metal solder, lead-free metal solder, a conductive resin, and the like. Examples of the semiconductor chip 14 include wide bandgap semiconductors and other semiconductors such as silicon. The wide bandgap semiconductors have a bandgap greater than that of silicon. Examples of the wide bandgap semiconductors include silicon carbide (SiC), gallium nitride (GaN), and diamond.

An inner end part of the lead 16 is mechanically integrally connected to the die pad 12. The die pad 12 is conductive, so that the lead 16 and the die pad 12 are electrically connected to each other. Examples of materials for the lead 16 include those of the die pad 12.

The lead 18 is connected to the semiconductor chip 14 through a wiring 30. One end of the wiring 30 is connected to an electrode pad GP of the semiconductor chip 14. The other end of the wiring 30 is connected to an inner end part of the lead 18.

The lead 20 is connected to the semiconductor chip 14 through first to fourth wirings 22*a* to 22*d*. The wirings 22*a* to 22*d* may have first end parts E1*a* to E1*d* connected to an electrode pad SP of the semiconductor chip 14 and second end parts E2*a* to E2*d* connected to an inner end part of the lead 20.

The end parts E1*a* to E1*d* of the wirings 22*a* to 22*d* are dispersedly arranged on the front face of the electrode pad SP. The end part E1*a* of the wiring 22*a* may be arranged at a position closer to the lead 20 than is the end part E1*b* of the wiring 22*b*. The end part E1*c* of the wiring 22*c* may be arranged at a position closer to the lead 20 than is the end part E1*d* of the wiring 22*d*. The end parts E1*a*, E1*c* are arranged in this order in the X direction. The end parts E1*b*, E1*d* are arranged in this order in the X direction. The end part E2*a* of the wiring 22*a* may be arranged at a position closer to the semiconductor chip 14 than is the end part E2*b* of the wiring 22*b*. The end part E2*c* of the wiring 22*c* may be arranged at a position closer to the semiconductor chip 14 than is the end part E2*d* of the wiring 22*d*. The end parts E2*a* to E2*d* are arranged in this order in the X direction.

As FIG. 2 illustrates, the lead 20 has a first surface S1 including a connection point P1 with the wiring 22*a* and a second surface S2 including a connection point P2 with the wiring 22*b*. The end part E2*c* of the wiring 22*c* is connected to the surface S1. The end part E2*d* of the wiring 22*d* is connected to the surface S2. The surface S1 may be arranged at a position closer to the semiconductor chip 14 than is the surface S2. The connection point P1 is located at a height H1 from a reference plane R which extends from the chip mount surface 12*a*. The reference plane R may be a plane parallel to the XY plane. The connection point P2 is located at a height H2 from the reference plane R. The height H2 differs from the height H1. The height H2 is higher than the height H1 in this embodiment.

The chip mount surface 12*a* and the reference plane R may be the same plane. The semiconductor chip 14 and the lead 20 may be arranged along the reference plane R. The surfaces S1, S2 may be parallel to the chip mount surface 12*a* and the reference plane R. The lead 20 may have a riser 20*a* disposed between the surfaces S1, S2. The riser 20*a* may be produced by bending a planar member by pressing or the like.

When the semiconductor chip 14 includes a MOS-FET, the lead 16 corresponds to the drain electrode terminal, the lead 18 corresponds to the gate electrode terminal, the lead 20 corresponds to source electrode terminal, the electrode pad GP corresponds to the gate electrode pad, the electrode pad SP corresponds to the source electrode pad. Examples of materials for the leads 18, 20 include metals such as copper and copper alloys. The wirings 22*a* to 22*d*, 30 may be wires or ribbons. Examples of materials for the wirings 22*a* to 22*d*, 30 include metals such as aluminum, gold, and copper. The wirings 22*a* to 22*d*, 30 are connected to the leads 18, 20 and semiconductor chip 14 by wire bonding using ultrasonic waves, pressures, or the like, for example.

The die pad 12 and semiconductor chip 14 may be sealed with a resin part 24. The inner end parts of the leads 16, 18, 20 are secured to the resin part 24. The parts of leads 16, 18, 20 on the inside of the resin part 24 are so-called inner lead parts. The parts of leads 16, 18, 20 on the outside of the resin part 24 are outer lead parts. An example of outer forms of the resin part 24 is a substantially rectangular parallelepiped. Examples of materials for the resin part 24 include thermoplastic resins such as polyphenylene sulfide resins (PPS resins) and liquid crystal polymers. The resin part 24 may be formed by molding the die pad 12 and semiconductor chip 14 with a thermoplastic resin. The resin part 24 is formed with a through hole 28 whose center axis aligns with that of the through hole 26 of the die pad 12. As with the through hole 26, the through hole 28 is a hole for inserting therethrough a screw or the like upon screwing, for example. The through hole 28 has a diameter smaller than that of the through hole 26.

In one embodiment, a bottom face 12*f* which is a surface of the die pad 12 on the side opposite from the chip mount surface 12*a* may be open. In other words, the bottom face 12*f* may be a surface not covered with the resin part 24. In this case, the bottom face 12*f* may function as a heat dissipation surface.

Figure 3:
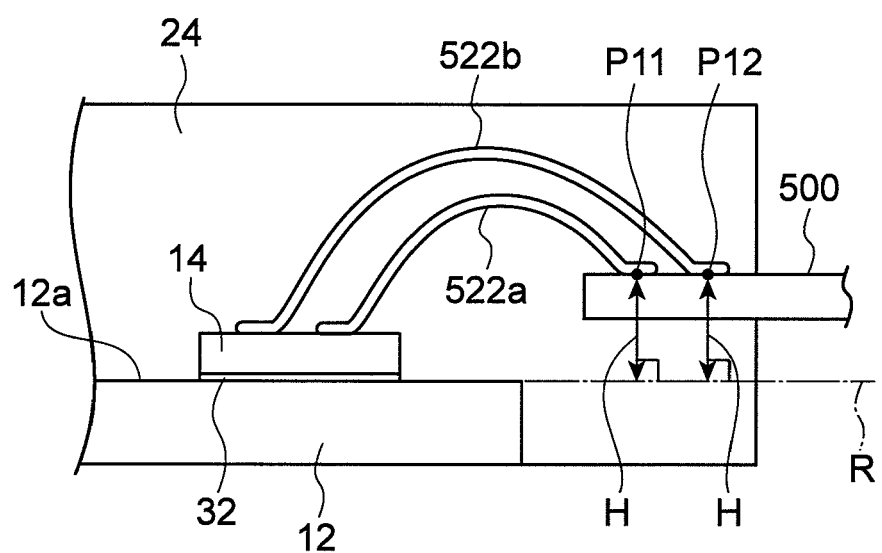
FIG. 3 is a diagram schematically illustrating a part of a semiconductor device for reference.

In the semiconductor device 10, the height H1 of the connection point P1 with the wiring 22*a* differs from the height H2 of the connection point P1 with the wiring 22*b*. In the semiconductor device illustrated in FIG. 3, on the other hand, respective connection points P11, P12 between a lead 500 and wirings 522*a*, 522*b* are at the same height H from the reference plane R. In this case, the distance between the wirings 522a, 522b in the height direction becomes relatively small, thereby raising the possibility of the wirings 522a, 522b coming into contact with each other. Hence, the semiconductor device 10 can achieve a greater distance between the wirings 22a, 22b in the height direction than the semiconductor device illustrated in FIG. 3 does. This yields the semiconductor device 10 in which the wirings 22a, 22b are hard to come into contact with each other.

When the lead 20 has the riser 20a disposed between the surfaces S1, S2, both of the surfaces S1, S2 can be arranged parallel to the reference plane R. This makes it easier for the wirings 22a, 22b to connect with the surfaces S1, S2, respectively.

The necessity for silicon to use a number of wirings 22a to 22d is low, since it allows only small currents to flow through the semiconductor chip 14. However, there is a higher necessity for wide bandgap semiconductors to increase the number of wirings 22a to 22d in order to inhibit currents from concentrating, since they let larger currents flow through the semiconductor chip 14. It is also harder for the wide bandgap semiconductors to make the semiconductor chip 14 larger, since they have a manufacturing yield lower than that of silicon. Therefore, a number of wirings 22a to 22d are connected to the small semiconductor chip 14 made of the wide bandgap semiconductor. It is therefore important in particular for the wide bandgap semiconductors to prevent wirings 22a to 22d from coming into contact with each other.

Second Embodiment

Figure 4:
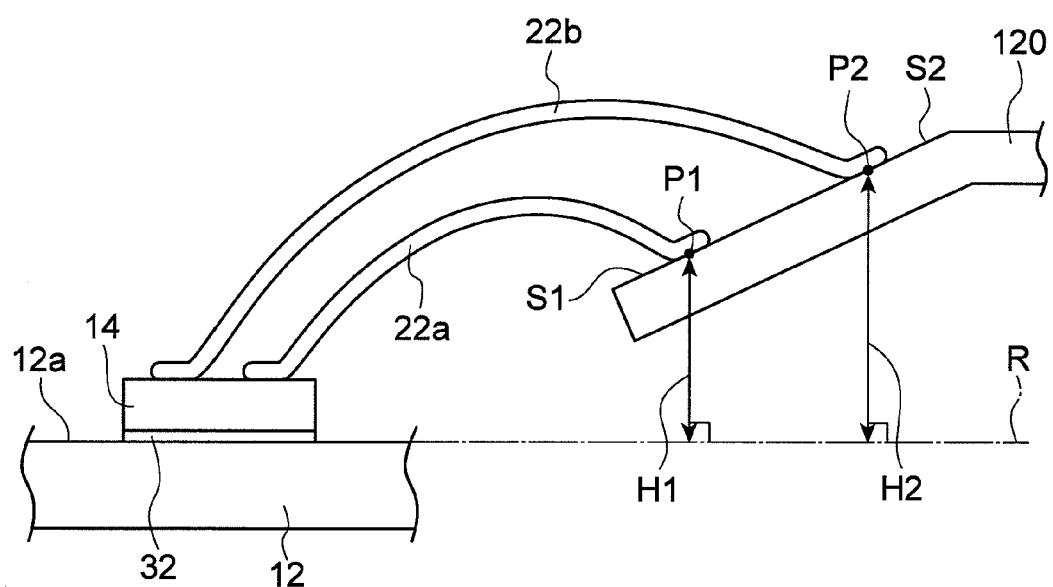
FIG. 4 is a diagram schematically illustrating a part of the semiconductor device in accordance with a second embodiment.
Figure 4:
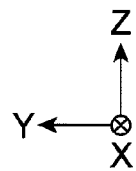

FIG. 4 is a diagram schematically illustrating a part of the semiconductor device in accordance with the second embodiment. FIG. 4 corresponds to FIG. 2. The semiconductor device in accordance with the second embodiment is constructed as with the semiconductor device 10 except that it comprises a lead 120 in place of the lead 20. The lead 120 has surfaces S1, S2 tilted with respect to the reference plane R. The surfaces S1, S2 are adjacent to each other. The surfaces S1, S2 are on the same plane. An inner end part of the lead 120 extends in a direction tilted with respect to the reference plane R. The lead 120 can be produced by pressing or the like. The semiconductor device in accordance with the second embodiment can attain at least the same operations and effects as those of the semiconductor device 10.

Third Embodiment

Figure 5:
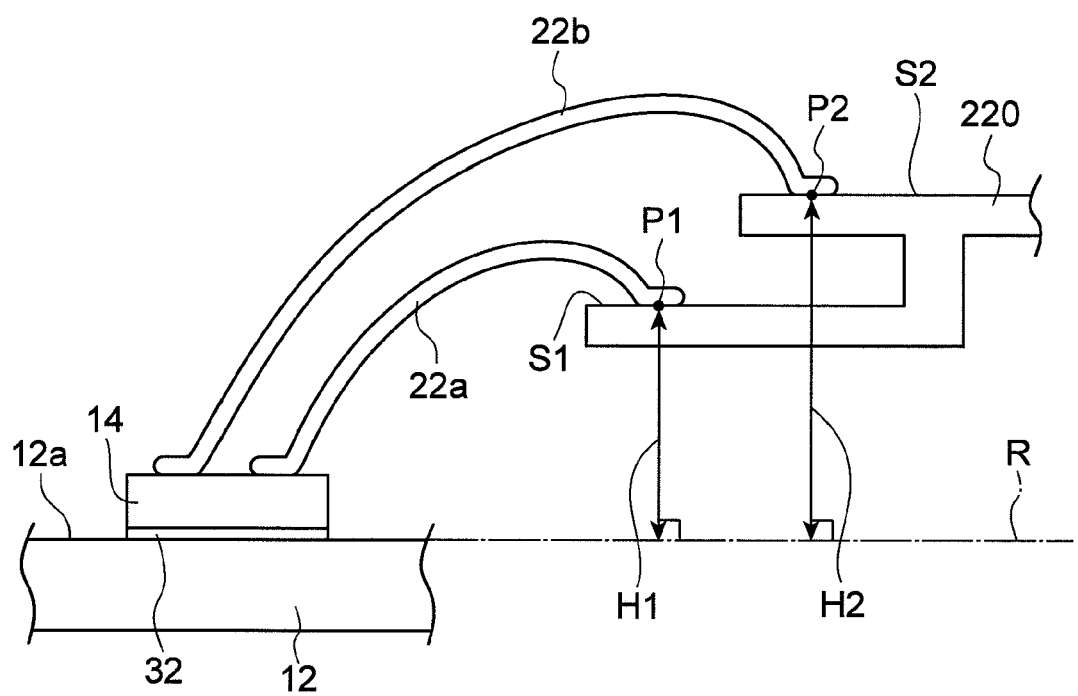
FIG. 5 is a diagram schematically illustrating a part of the semiconductor device in accordance with a third embodiment.

FIG. 5 is a diagram schematically illustrating a part of the semiconductor device in accordance with the third embodiment. FIG. 5 corresponds to FIG. 2. The semiconductor device in accordance with the third embodiment is constructed as with the semiconductor device 10 except that it comprises a lead 220 in place of the lead 20. An inner end part of the lead 220 branches into a part having a surface S1 and a part having a surface S2. The surfaces S1, S2 are parallel to the chip mount surface 12a and reference plane R. The lead 220 can be produced by pressing, welding, or the like. The semiconductor device in accordance with the third embodiment can attain at least the same operations and effects as those of the semiconductor device 10.

Fourth Embodiment

Figure 6:
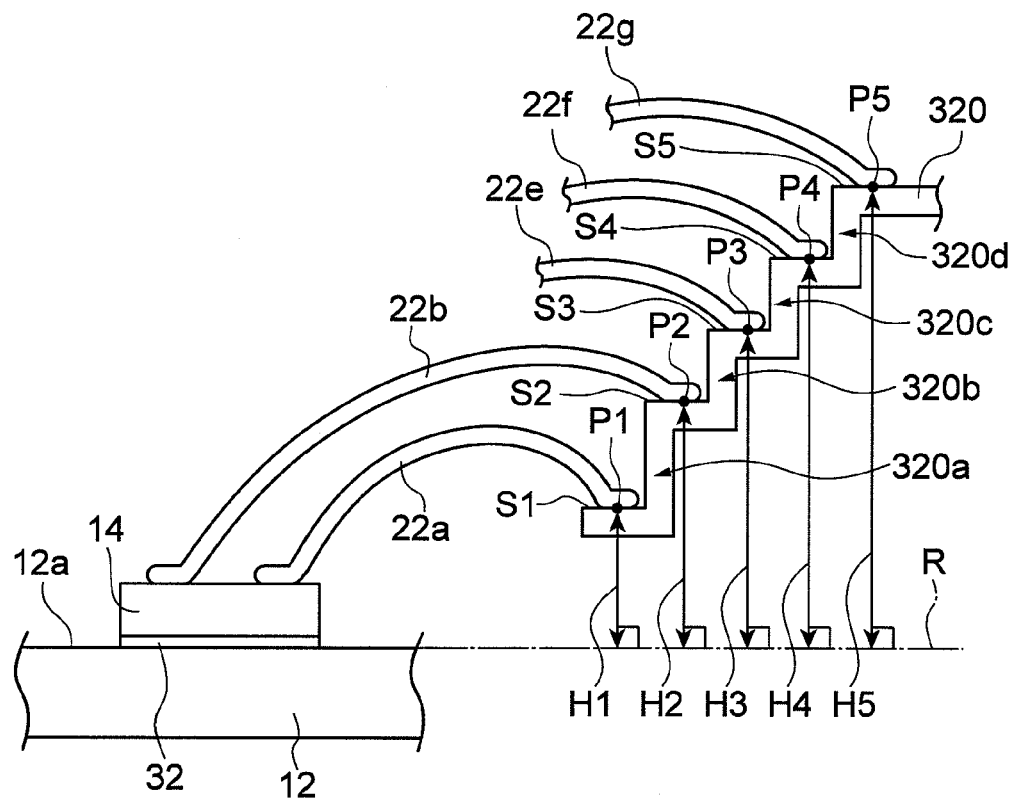
FIG. 6 is a diagram schematically illustrating a part of the semiconductor device in accordance with a fourth embodiment.

FIG. 6 is a diagram schematically illustrating a part of the semiconductor device in accordance with the fourth embodiment. FIG. 6 corresponds to FIG. 2. The semiconductor device in accordance with the fourth embodiment is constructed as with the semiconductor device 10 except that it has a lead 320 in place of the lead 20 and further comprises wirings 22e to 22g. An inner end part of the lead 320 has a number of risers 320a to 320d. As with the wirings 22a to 22d, the wirings 22e to 22g electrically connect the semiconductor chip 14 and the lead 320 to each other.

The lead 320 has surfaces S1 to S5. The surfaces S3 to S5 include respective connection points P3 to P5 with the wirings 22e to 22g. The connection points P3 to P5 are located at heights H3 to H5 from the reference plane R, respectively. The heights H3 to H5 differ from one another. The heights H1 to H5 increase in this order. The surfaces S1 to S5 are parallel to the chip mount surface 12a and reference plane R. A riser 320a is disposed between the surfaces S1, S2. A riser 320b is disposed between the surfaces S2, S3. A riser 320c is disposed between the surfaces S3, S4. A riser 320d is disposed between the surfaces S4, S5. The lead 320 can be produced by pressing or the like. The semiconductor device in accordance with the fourth embodiment can attain at least the same operations and effects as those of the semiconductor device 10.

Fifth Embodiment

Figure 7:
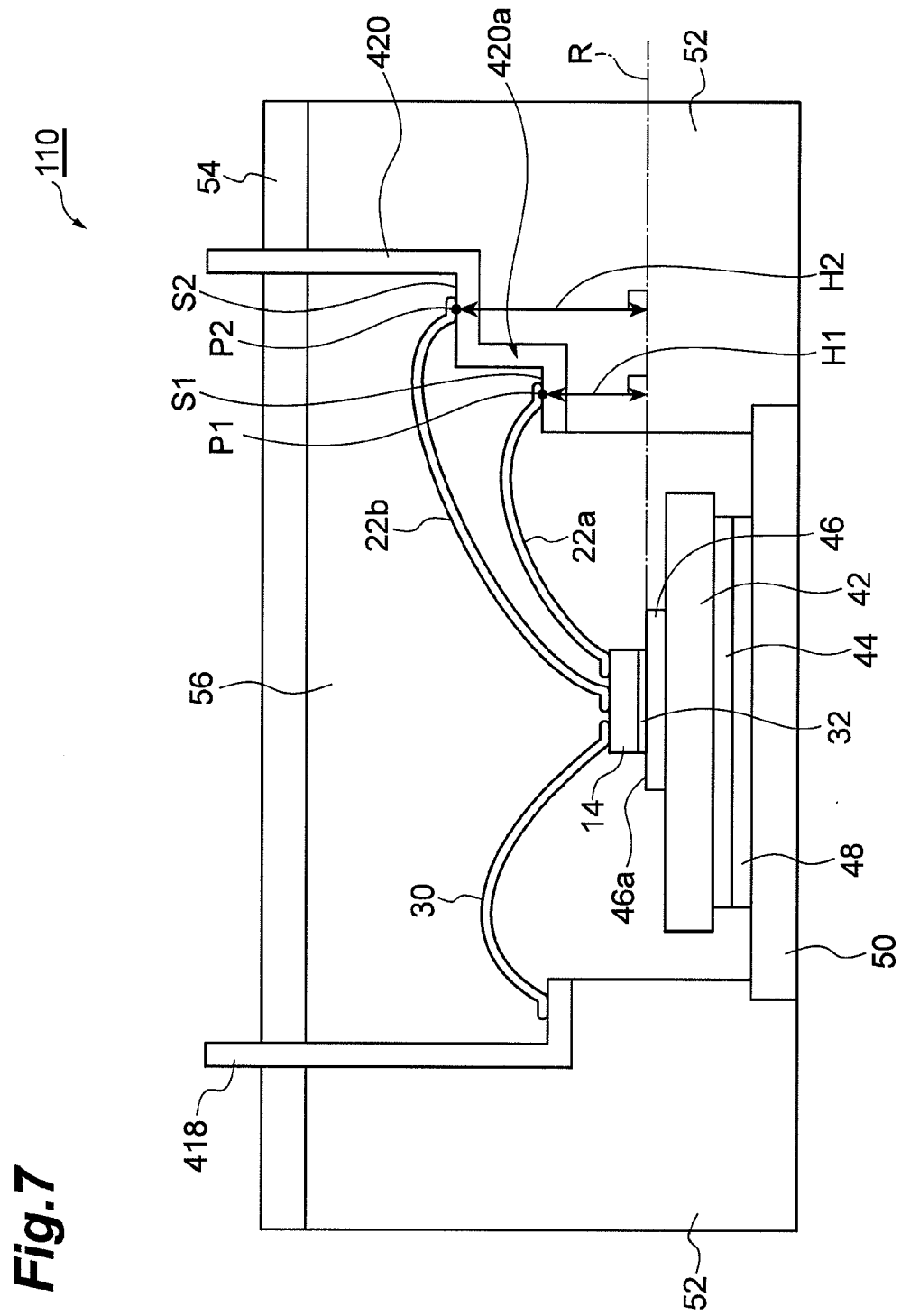
FIG. 7 is a diagram schematically illustrating a part of the semiconductor device in accordance with a fifth embodiment.

FIG. 7 is a diagram schematically illustrating the semiconductor device in accordance with the fifth embodiment. The semiconductor device 110 illustrated in FIG. 7 is a case-shaped semiconductor device. The semiconductor device 110 comprises a die pad 46, a semiconductor chip 14, an electrode terminal 420, and a case 52.

The die pad 46 has a chip mount surface 46a for mounting the semiconductor chip 14. The semiconductor chip 14 is mounted on the chip mount surface 46a with a bonding layer 32. The electrode terminal 420 is connected to the semiconductor chip 14 through first and second wirings 22a, 22b. As with the lead 20 of the semiconductor device 10 illustrated in FIGS. 1 and 2, the electrode terminal 420 has surfaces S1, S2. A riser 420a is disposed between the surfaces S1, S2.

The die pad 46 is a wiring layer disposed on the front face of an insulating substrate 42. Examples of materials for the die pad 46 include metals such as copper and copper alloys. Examples of materials for the insulating substrate 42 include ceramics such as alumina. The rear face of the insulating substrate 42 may be provided with a heat dissipation layer 44. Examples of materials for the heat dissipation layer 44 include metals such as copper and copper alloys. The heat dissipation layer 44 is bonded to a heat sink 50 with a bonding layer 48 made of solder or the like, for example. Examples of materials for the heat sink 50 include metals.

The semiconductor chip 14, die pad 46, insulating substrate 42, and heat dissipation layer 44 are contained in the case 52. The case 52 is tubular, for example. One opening of the case 52 can be sealed with the heat sink 50. The other opening of the case 52 can be sealed with a lid 54. Examples of materials for the case 52 include resins such as engineering plastics typified by polybutylene terephthalate (PBT) or polyphenylene sulfide (PPS) resin. Examples of materials for the lid 54 include thermoplastic resins. For example, a gel 56 such as silicone gel may be injected into the case 52 in order to mitigate stress.

The semiconductor 110 may be equipped with an electrode terminal 418. The electrode terminal 418 is connected to the semiconductor chip 14 through a wiring 30. The electrode terminals 418, 420 are attached to the inner wall of the case 52. The electrode terminals 418, 420 extend along the inner wall of the case 52 and project out through respective openings formed in the lid 54. The electrode terminals 418, 420 can be produced by pressing or the like. The case 52 has a riser extending along the riser 420*a* of the electrode terminal 420. The riser of the case 52 can be produced by molding or the like. When the semiconductor chip 14 includes a MOS-FET, the electrode terminal 418 corresponds to the gate electrode terminal and the electrode terminal 420 corresponds to the source electrode terminal. No drain electrode terminal is depicted here. The semiconductor device in accordance with the fifth embodiment can attain at least the same operations and effects as those of the semiconductor device 10.

The present invention is not limited to the preferred embodiments explained in detail in the foregoing.

For example, the semiconductor device 10 may be free of the third and fourth wirings 22*c*, 22*d* or comprise five or more wirings. The surfaces S1, S2 of the lead 20 may be arranged along the X direction instead of the Y direction. A plurality of semiconductor chips 14 may be arranged on the chip mount surface 12*a* of the die pad 12. This increases the number of wirings in the semiconductor device, which makes it particularly important to prevent the wirings from coming into contact with each other.

What is claimed is:

1. A semiconductor device comprising:
   a semiconductor chip;
   a die pad having a chip mount surface for mounting the semiconductor chip; and
   an electrode terminal for connecting with the semiconductor chip through first and second wirings;
   wherein a material of the semiconductor chip includes a wide bandgap semiconductor,
   wherein the electrode terminal has a first surface including a connection point with the first wiring and a second surface including a connection point with the second wiring;
   wherein the connection point with the first wiring is located at a first height from a reference plane extending from the chip mount surface;
   wherein the connection point with the second wiring is located at a second height different from the first height from the reference plane; and
   wherein the first wiring has an end part connected to the semiconductor chip, wherein the second wiring has an end part connected to the semiconductor chip, and wherein the end part of the first wiring is arranged at a position closer to the electrode terminal than is the end part of the second wiring.

2. The semiconductor device according to claim 1, wherein the electrode terminal has a riser disposed between the first and second surfaces.

3. The semiconductor device according to claim 1, further comprising a case for containing the semiconductor chip and the die pad;
   wherein the electrode terminal is attached to the case.

* * * * *